US011976869B2

(12) United States Patent
Bendig et al.

(10) Patent No.: US 11,976,869 B2
(45) Date of Patent: May 7, 2024

(54) SYSTEMS AND METHODS OF ACCURATE TOUCHLESS DISPENSING

(71) Applicant: Marmon Foodservice Technologies, Inc., Osseo, MN (US)

(72) Inventors: James Bendig, Naperville, IL (US); E. Scott Sevcik, Crystal Lake, IL (US); David K. Njaastad, Palatine, IL (US); Andrew J. Tobler, Geneva, IL (US)

(73) Assignee: Marmon Foodservice Technologies, Inc., Osseo, MN (US)

( * ) Notice: Subject to any disclaimer, the term of this patent is extended or adjusted under 35 U.S.C. 154(b) by 303 days.

(21) Appl. No.: 17/374,272

(22) Filed: Jul. 13, 2021

(65) Prior Publication Data

US 2022/0018586 A1 Jan. 20, 2022

Related U.S. Application Data

(60) Provisional application No. 63/052,095, filed on Jul. 15, 2020.

(51) Int. Cl.
*F25C 5/20* (2018.01)

(52) U.S. Cl.
CPC ............ *F25C 5/20* (2018.01); *F25C 2600/04* (2013.01); *F25C 2700/00* (2013.01)

(58) Field of Classification Search
CPC ..... F25C 5/20; F25C 2600/04; F25C 2700/00
(Continued)

(56) References Cited

U.S. PATENT DOCUMENTS 5,036,892 A * 8/1991 Stembridge .......... B67D 3/0003
367/908
5,868,311 A 2/1999 Cretu-Petra
(Continued)

FOREIGN PATENT DOCUMENTS

CN 107750231 A * 3/2018 ........... B67D 1/0081
CN 105264312 B 6/2018
(Continued)

OTHER PUBLICATIONS

Extended European Search Report for Application No. EP21185799.0, dated Dec. 17, 2021.
(Continued)

*Primary Examiner* — Paul R Durand
*Assistant Examiner* — Michael J. Melaragno
(74) *Attorney, Agent, or Firm* — Andrus Intellectual Property Law, LLP

(57) ABSTRACT

An example of a system for touchlessly dispensing ice into a receptacle includes a dispense chute configured to direct dispensed ice therethrough to a dispense area. A visual feedback device is configured to present a visual indication of an operational status of the system. A sensor is configured to produce a beam within the dispense area and to provide a signal indicative of a proximity of an object within the beam to the sensor. A controller is configured to receive the signal and to determine the proximity of the object to the sensor from the signal. The controller is configured to operate the system to initiate a dispense of ice through the dispense chute based upon the determined proximity of the object. The controller is configured to operate the visual feedback device to present a visual indication of the initiated ice dispense.

18 Claims, 8 Drawing Sheets

(58) Field of Classification Search
USPC .......................................................... 222/23
See application file for complete search history.

(56) References Cited

U.S. PATENT DOCUMENTS

| | | | |
|---|---|---|---|
| 5,902,998 | A | 5/1999 | Olson et al. |
| 6,053,359 | A | 4/2000 | Goulet et al. |
| 6,354,468 | B1 | 3/2002 | Riek |
| 6,394,153 | B2 | 5/2002 | Skell et al. |
| 6,688,134 | B2 | 2/2004 | Barton et al. |
| 6,789,585 | B1 | 9/2004 | Janke |
| 7,614,524 | B2 | 11/2009 | Girard et al. |
| 7,673,661 | B2 | 3/2010 | Chase et al. |
| 8,109,301 | B1 | 2/2012 | Denise |
| 8,490,540 | B2 | 7/2013 | Webster et al. |
| 8,505,593 | B1 * | 8/2013 | Denise ................ B67D 1/1236 141/351 |
| 8,695,646 | B2 * | 4/2014 | Agam ..................... G01S 15/87 141/94 |
| 8,950,254 | B2 | 2/2015 | Bernhardsgruetter et al. |
| 9,417,003 | B2 | 8/2016 | Baack |
| 9,477,317 | B1 | 10/2016 | Clements |
| 9,487,384 | B1 * | 11/2016 | Denise ................ F25D 29/001 |
| 9,840,407 | B2 | 12/2017 | Difatta et al. |
| 10,023,456 | B1 * | 7/2018 | Denise ................ F25D 23/028 |
| 10,046,960 | B1 * | 8/2018 | Denise .................... G07F 9/023 |
| 10,053,354 | B2 | 8/2018 | Rosenlund et al. |
| 10,178,928 | B2 | 1/2019 | Ophardt et al. |
| 10,235,865 | B2 | 3/2019 | Thyroff |
| 10,258,191 | B2 | 4/2019 | Apone et al. |
| 10,269,082 | B2 | 4/2019 | Morris et al. |
| 10,362,896 | B2 | 7/2019 | Apone et al. |
| 10,571,041 | B2 | 2/2020 | Bischel |
| 10,829,361 | B1 * | 11/2020 | Denise .................... G07F 13/10 |
| 11,117,793 | B1 * | 9/2021 | Khan ................... B67D 1/1238 |
| 11,472,693 | B2 * | 10/2022 | Bendig ................ B67D 1/1238 |
| 2003/0155031 | A1 | 8/2003 | Barton et al. |
| 2005/0252933 | A1 * | 11/2005 | Manisco .............. B67D 1/0888 222/113 |
| 2008/0156395 | A1 * | 7/2008 | Janardhanam ........ F25D 23/126 141/351 |
| 2008/0282897 | A1 | 11/2008 | Webster et al. |
| 2009/0178728 | A1 | 7/2009 | Cochran et al. |
| 2009/0308494 | A1 | 12/2009 | Linn |
| 2011/0061766 | A1 * | 3/2011 | Beier ........................ F25C 5/22 141/192 |
| 2013/0075426 | A1 | 3/2013 | Crane et al. |
| 2014/0224375 | A1 * | 8/2014 | Willis .................. B67D 1/0858 141/94 |
| 2016/0207753 | A1 | 7/2016 | Choi et al. |
| 2016/0368754 | A1 * | 12/2016 | Rosenlund ................ F25C 5/20 |
| 2017/0079468 | A1 | 3/2017 | Apone et al. |
| 2017/0079469 | A1 | 3/2017 | Apone et al. |
| 2018/0201492 | A1 | 7/2018 | Jung et al. |
| 2018/0327243 | A1 | 11/2018 | Rider et al. |
| 2019/0223654 | A1 | 7/2019 | Apone et al. |
| 2020/0000274 | A1 | 1/2020 | Apone et al. |
| 2020/0055720 | A1 | 2/2020 | Volftsun et al. |
| 2021/0347628 | A1 * | 11/2021 | Bendig ................ B67D 1/0888 |
| 2022/0018586 | A1 * | 1/2022 | Bendig ................ H03K 17/941 |

FOREIGN PATENT DOCUMENTS

| | | | | |
|---|---|---|---|---|
| EP | 1647951 | A1 | 4/2006 | |
| EP | 2449929 | A1 | 5/2012 | |
| EP | 3172970 | A1 | 5/2017 | |
| EP | 3275348 | A1 | 1/2018 | |
| EP | 3670436 | A1 | 6/2020 | |
| EP | 3939932 | A1 * | 1/2022 | ........... B67D 1/0888 |
| EP | 3940319 | A1 * | 1/2022 | ................ F25C 5/20 |
| WO | 2012048405 | A1 | 4/2012 | |
| WO | WO-2012048405 | A1 * | 4/2012 | .............. A47J 31/44 |
| WO | 2016204924 | A1 | 12/2016 | |
| WO | 2018052894 | A1 | 3/2018 | |
| WO | WO-2018052894 | A1 * | 3/2018 | ............... B67D 1/00 |

OTHER PUBLICATIONS

International Search Report and Written Opinion for PCT/US2021/035654, dated Sep. 1, 2021.

* cited by examiner

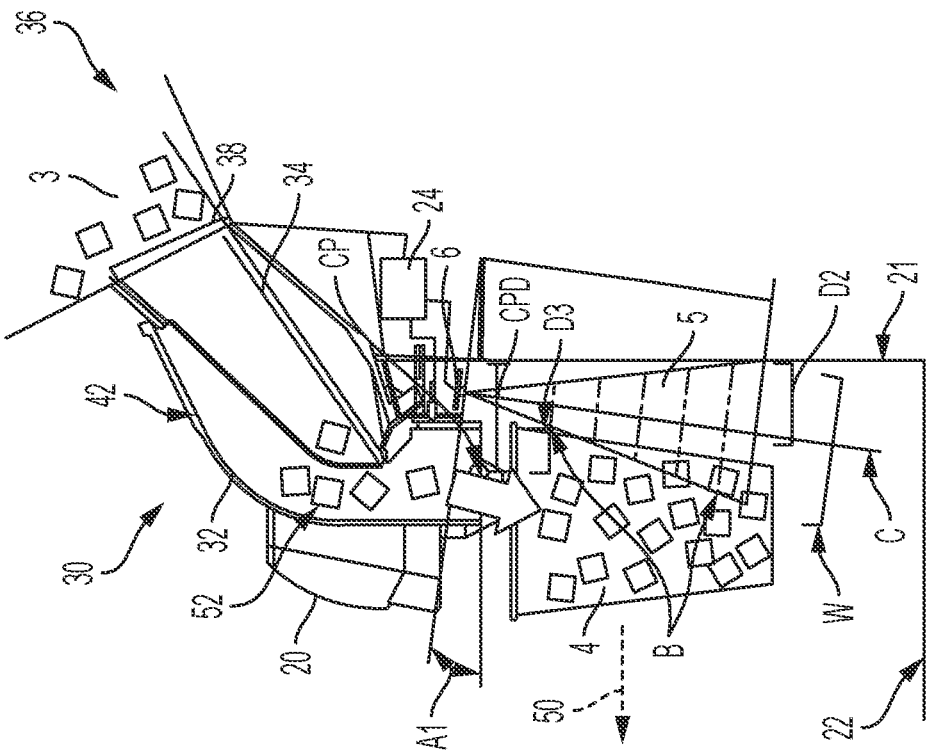
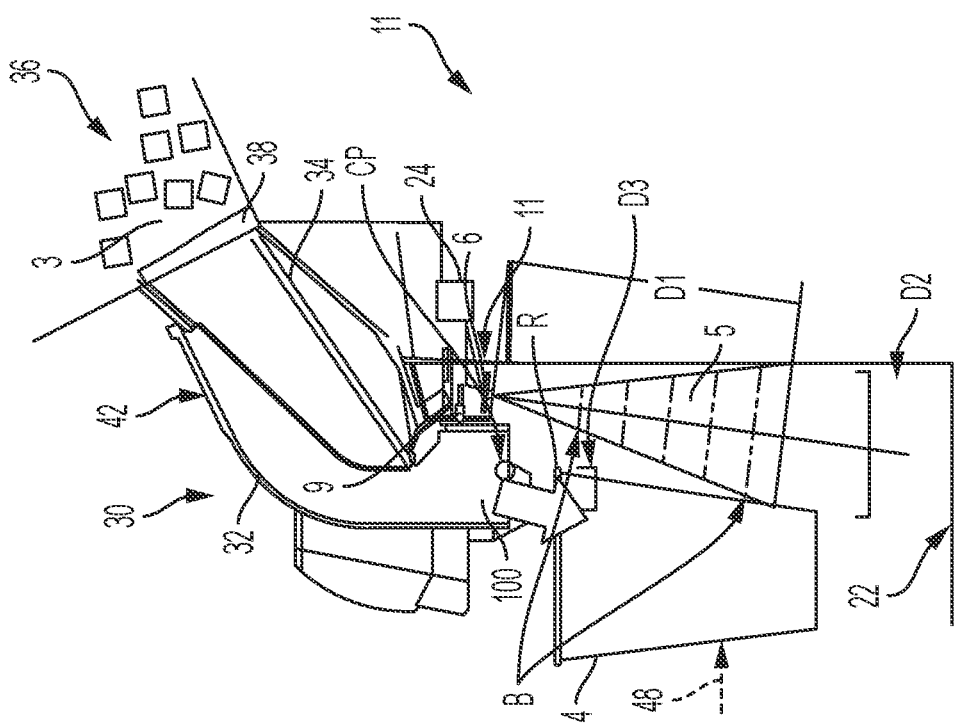
FIG. 4A
FIG. 4B

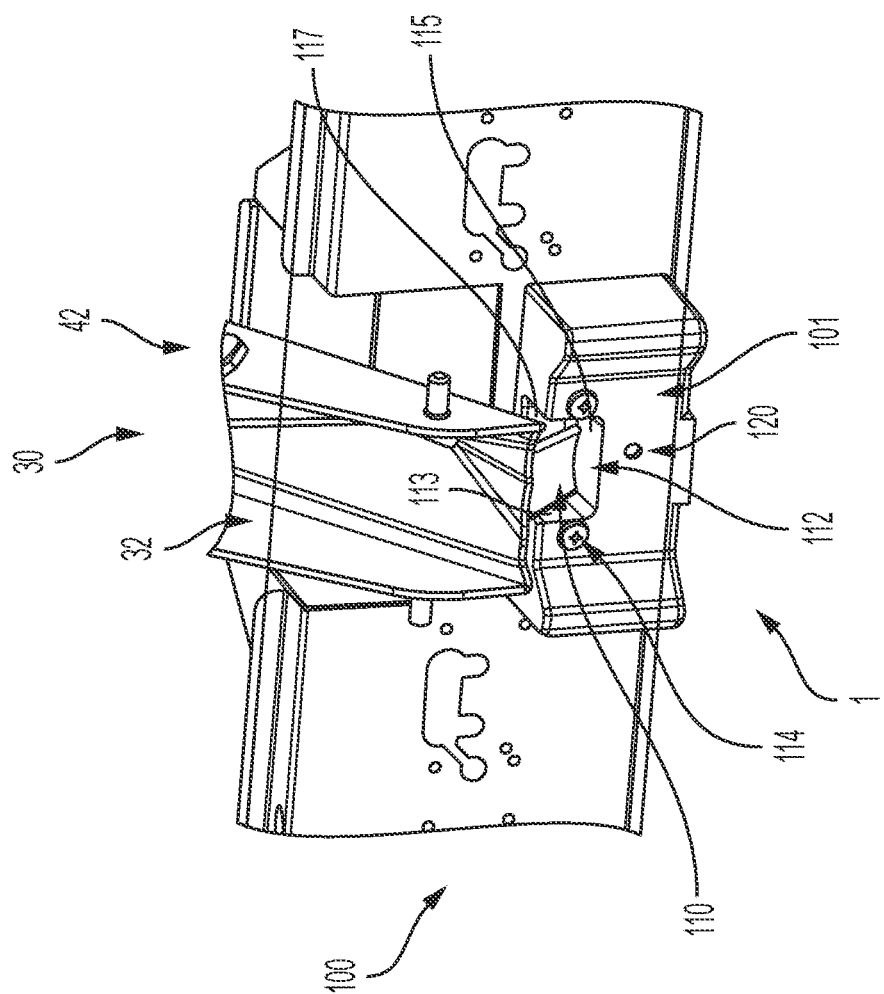

SYSTEMS AND METHODS OF ACCURATE TOUCHLESS DISPENSING

CROSS-REFERENCE TO RELATED APPLICATIONS

The present application claims priority of U.S. Provisional Patent Application No. 63/052,095, filed on Jul. 15, 2020, the disclosure of which is incorporated by reference in its entirety.

FIELD

The present disclosure generally relates to systems and methods of accurate touchless dispensing, and more particularly to systems and methods of accurate touchless dispensing of ice into a container.

BACKGROUND

The following U.S. Patents and Patent Applications provide background information and are incorporated by reference in entirety.

U.S. Pat. No. 10,077,180 discloses a beverage dispensing head with a mixing nozzle configured to dispense a flow of beverage. A valve is configured to control the flow of beverage via the mixing nozzle and a switch is movable into and between a closed position in which the valve opens the flow of beverage via the mixing nozzle and an open position in which the valve closes the flow of beverage via the mixing nozzle. A lighting module disposed in the housing is configured to illuminate the front of the housing and the base of the housing when the switch is moved into the closed position.

U.S. Pat. No. 9,840,407 discloses a beverage dispensing system that includes a plurality of beverage sources each containing a beverage component, and at least one flow valve connected to one or more of the beverage sources and operable to control a flow of the beverage component therefrom. The system further includes a graphical display that presents a plurality of available beverages and a gesture capture device that receives a selection gesture input to select a beverage from the plurality of available beverages. A controller is also included that adjusts the at least one flow valve based on the selection gesture input to dispense the selected beverage.

U.S. Pat. No. 6,053,359 discloses an automated system for preparing and delivering postmix beverages in response to one or more drink orders being entered from a remote point of sale unit or a local keypad that includes: a postmix beverage preparation assembly for dispensing ice and a selected postmix beverage into a cup; an oblong carousel type conveyor assembly including a plurality of upwardly open cup holders which are driven by a motor driven belt so as to pass beneath a cup dispensing station, an ice dispensing station, a beverage dispensing station, and a plurality of pick-up stations; a cup storage and dispenser assembly including a bidirectionally rotatable turret upon which is mounted a plurality of different sized cup supply tubes for holding a respective stack of beverage cups; and a pneumatic vertically driven cup gripper/extractor mechanism having a pair of pneumatically operated gripper arms which operate to remove a cup from a selected supply tube on the turret and placing the extracted cup into an empty cup holder which is then transported past the dispensing stations and then to a pick-up station on the conveyor for manual removal by an attendant.

U.S. Patent Application Publication No. 2013/0075426 discloses a beverage dispensing apparatus that includes a dispensing structure, a transportation mechanism linked with the dispensing structure and a staging structure linked with the transportation structure. A control system is linked with the dispensing structure, staging structure, and the transportation mechanism. A sensor mechanism is linked with the control system. The sensor mechanism provides signals indicating the position of a cup. A cup identification system having an interactive display is connected to the control system. The display has visual characteristics indicating the position and characteristics of a cup.

BRIEF DISCLOSURE

An example of a system for touchlessly dispensing ice into a receptacle includes a dispense chute configured to direct dispensed ice therethrough to a dispense area. A visual feedback device is configured to present a visual indication of an operational status of the system. A sensor is configured to produce a beam within the dispense area. The sensor is configured to provide a signal indicative of a proximity of an object within the beam to the sensor. A controller is configured to receive the signal from the sensor and to determine the proximity of the object to the sensor from the signal. The controller is configured to operate the system to initiate a dispense of ice through the dispense chute based upon the determined proximity of the object. The controller is configured to operate the visual feedback device to present a visual indication of the initiated ice dispense.

In examples of the system, the sensor is located within a housing positioned between the dispense chute and a back wall that at least partially defines the dispense area. The beam may be a cone beam and a center line of the cone beam is angled relative to the vertical into the dispense area. The controller may initiate the dispense of ice based upon a detection of an object within a detection band of proximity to the sensor. The controller may initiate the dispense of ice after the object has been detected within the detection band of proximity to the sensor for a predetermined delay time. The controller may determine a distance of the object from the back wall from the signal from the sensor. The controller may operate to compare the determined distance of the object from the back wall to a distance of the dispense chute to the back wall, and operates to end the dispense of ice based upon the comparison. The controller may operate to end the dispense of ice when the distance of the object from the back wall reaches a threshold distance to a center point of the opening of the dispense chute.

In further examples of the system at least one electromechanical dispense component is arranged between a hopper configured to hold ice and the dispense chute. The controller operates the at least one electromechanical dispense component to initiate the dispense of ice. The electromechanical dispense component may include a valve.

In additional examples of the system, the visual feedback device is located behind the dispense chute. The visual feedback device may include a light-emitting diode (LED) and the dispense chute is transmissive to light and light emitted from the LED passes through the dispense chute. The visual feedback device may be located within the housing with the sensor. The housing may further include at least one lip extending forward of the housing to direct condensation away from the visual feedback device. The housing may further include at least one lip extending downward from the housing to direct condensation away from the sensor. The dispense chute may further include an alignment tab and the housing may further include a cavity in the top and front surfaces of the housing. The alignment tab may be received within the cavity to locate the visual feedback device and the sensor relative to the dispense chute.

Another example of a system for touchlessly dispensing ice into a receptacle includes a dispense chute configured to direct dispensed ice therethrough to a dispense area at least partially defined by a back wall. At least one electromechanical dispense component is arranged between a hopper configured to hold ice and the dispense chute. A housing is positioned between the dispense chute and the back wall. A visual feedback device is located within the housing and configured to present a visual indication of an operational status of the system. A sensor is located within the housing and configured to produce a cone beam and a center line of the cone beam is angled relative to the vertical into the dispense area and to provide a signal indicative of a proximity of an object within the cone beam to the sensor. A controller is configured to receive the signal from the sensor and to determine the proximity of the object to the sensor from the signal. The controller is configured to operate the at least one electromechanical dispense component to initiate a dispense of ice from the hopper through the dispense chute based upon a detection of the object within a detection band of proximity to the sensor. The controller is configured to operate the visual feedback device to present a visual indication of the initiated ice dispense.

In further examples of the system, the visual feedback device includes a light-emitting diode (LED) and the dispense chute is transmissive to light, wherein light emitted from the LED passes through the dispense chute. The controller may initiate the dispense of ice after the object has been detected within the detection band of proximity to the sensor for a predetermined delay time. The controller may further operate to determine a distance of the object from the back wall from the signal from the sensor and to compare the determined distance of the object from the back wall to a distance of the dispense chute to the back wall. The controller may operate to end the dispense of ice when the determined distance of the object from the back wall reaches a threshold distance to a center point of the opening of the dispense chute.

BRIEF DESCRIPTION OF THE DRAWINGS

The present disclosure is described with reference to the following Figures.

FIGS. 4A and 4B are side sectional views of an example of operation of the ice dispensing system.

FIG. 5 is a perspective view of an example of a portion of the ice dispensing system.

DETAILED DISCLOSURE

The present disclosure generally relates to controls for dispensers, such as beverage and/or ice dispensers, and particularly touchless dispensing therefrom. Dispensers traditionally use actual levers or buttons that are pressed against by a cup, finger, or hand to trigger dispensing into the cup. The present inventors have identified problems with these systems, including the forces required to actuate such levers causing deformation of the cup, for example. There are also problems with beverage and/or continuing to fall from the dispensing nozzle or ice chute, as the case may be, after the cup has been at least partially removed. This creates a mess for the dispenser owner, in some cases splashes on the hands or property of the user, and/or creates a generally unpleasant user experience.

Moreover, in the present world reacting to COVID-19 and other concerns for transitions of viruses and/or bacteria, there is a strong need and desire to move to touchless interactions in place of the levers and push buttons traditionally used. An exemplary system for actuated the dispensing process is provided in U.S. Pat. No. 9,840,407, which is incorporated by reference in its entirety herein.

Figure 1:
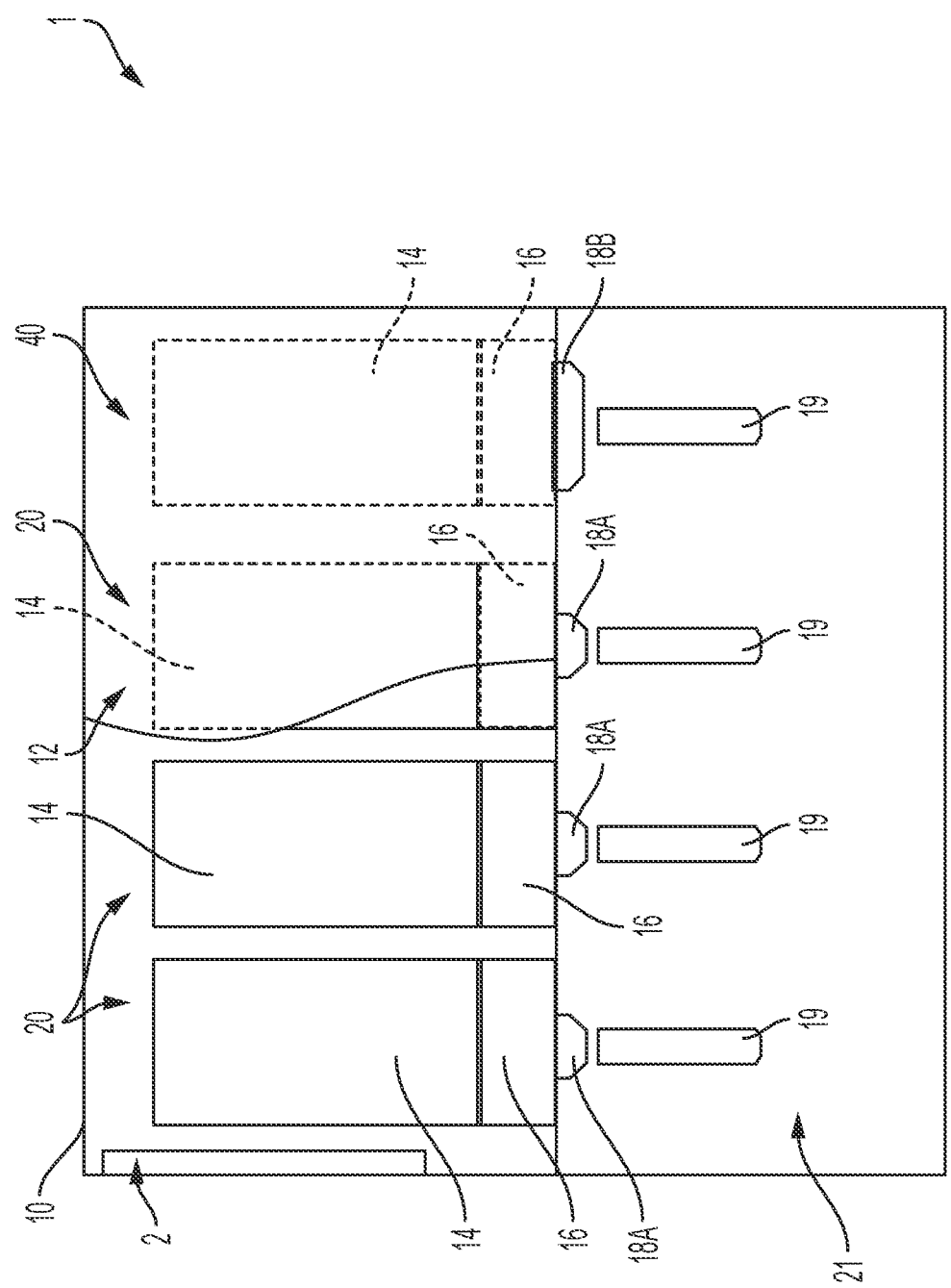
FIG. 1 depicts a front view of an exemplary beverage and ice dispenser as known in the art.

The systems and methods presently disclosed generally relate to this lack of accuracy with regard to the starting and stopping of dispensing, as well as the elimination of any contact by human or physical cup contact. FIG. 1 depicts a dispenser 1 as may be known in the art, which is configured to dispense both beverages and ice, for example. The dispenser 1 has a housing 10 that contains a beverage dispensing subsystem 20 and an ice dispensing subsystem 40. A portion of a front display 12 is shown, which may be a touch screen or other types of front panels as known in the art. The beverages and ice to be dispensed are contained within content reservoirs 14 and dispensed via dispensing hardware 16 through actuation of actuation levers 19, for example upon receiving a force from a cup, in a customary manner. Beverages are dispensed via nozzles 18A and ice is dispensed through a chute 18B for each of the respective beverage dispensing subsystems 20 and/or ice dispensing subsystems 40. The dispenser 1 is controlled via a control system 2 in a customary manner, for example to handle refrigeration and communication between the front display 12 and the dispensing hardware 16.

The inventor has recognized that the dispenser 1 shown in FIG. 1 may be configured according to the present disclosure, whether upfront or as a retrofittable option, allow for touchless selection between modes of operation (for example cleaning versus dispensing), and also touchless dispensing. These touchless controls may be incorporated to replace the actuation levers 19 shown in FIG. 1, or added thereto, for example. Additional discussion regarding the sensors and logic used to select between modes and/or dispense are provided below.

Figure 2:
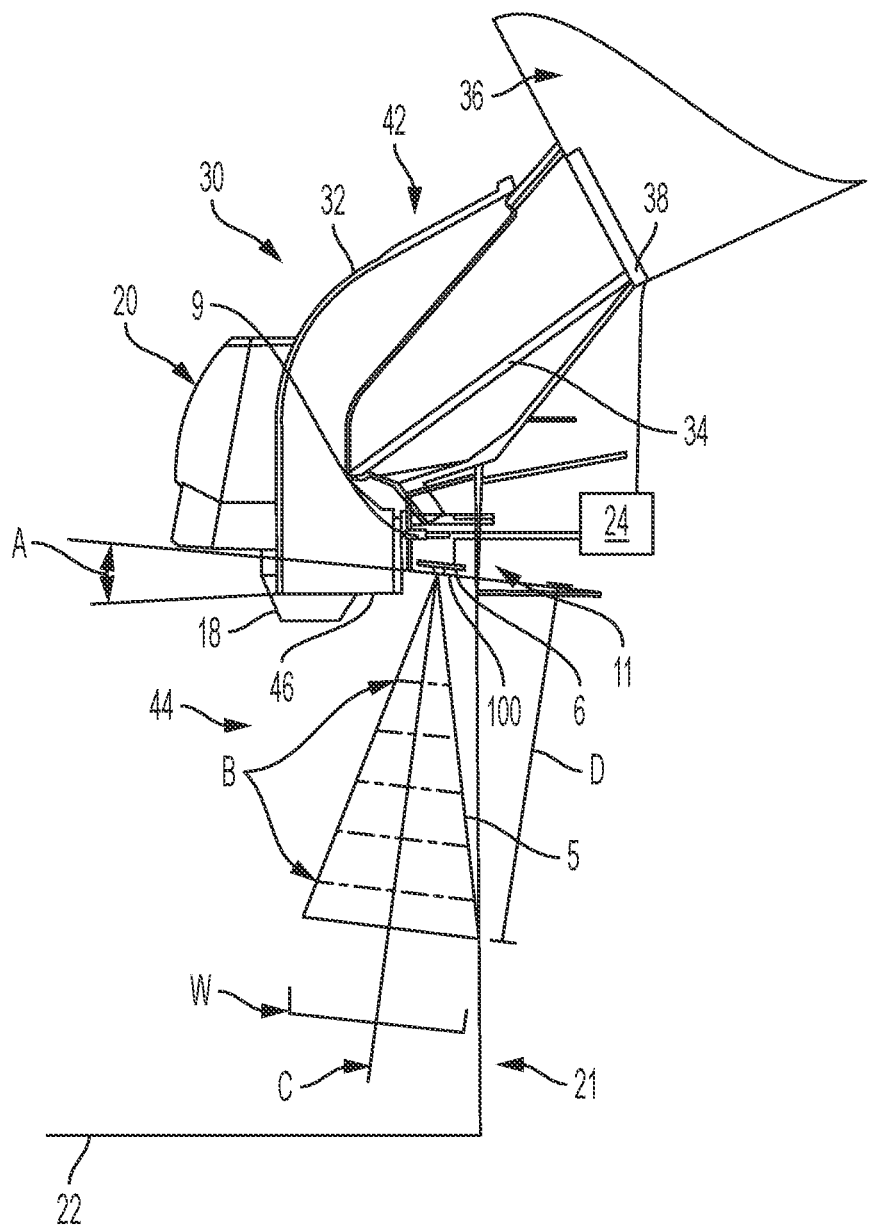
FIG. 2 is side sectional view of an example of an ice dispensing system.

FIG. 2 is a side view of an example of an ice dispensing system 30 as disclosed herein. An example of a beverage dispensing system 20 including the nozzle 18A as described above can exemplarily be seen behind the ice dispensing system 30 in this view. The ice dispensing system 30 includes a detection system 11 in combination with the ice dispensing system 30 which enables touchless dispensing according to the present disclosure. While FIG. 2 and the description herein will focus on the dispense of ice; persons of ordinary skill in the art will recognize further applications of the present disclosure for configuration to dispense other substances, for example but not limited to beverages, hand sanitizer, or lotion. The ice dispensing system 30 includes a hopper 36 which is configured to store ice therein in a refrigerated condition. While not depicted, the hopper 36 may further include an auger or agitator which may operate to keep the ice in individual pieces, prevent bridging, and/or improve flow of ice as dispensed herein. An electromechanical dispense component 38, which may include one or more of a valve, which may be a gate, an agitator, or an auger separates the hopper 36 from a chute 42 which directs dispensed ice from the hopper 36 to a dispense area 44 below an outlet 46 of the chute. As will be described in further detail herein, the chute 42 may be constructed with a chute base 32 and a chute cover 34.

The electromechanical dispense component 38 may be operated in response to signals provided by a controller 24. The controller 24 operates to receive signals from a sensor 6 as will be described in further detail herein and to provide control signals to other components of the ice dispensing system 30, including electromechanical actuators for the electromechanical dispense component 38. The controller 24 is exemplarily a single board computer (SBC) or a central processing unit (CPU), that includes a processor. The processor of controller 24 may be integral with or communicatively connected to a computer-readable medium upon which computer-readable code is stored. Upon execution of the computer-readable code by the processor, the processor performs functions and calculations and subsequently transmits control signals as described herein. The controller 24, is communicably coupled to the sensor 6, the electromechanical dispense component 38, a visual feedback device 9 (which may be an LED), and/or other components of the ice dispensing system 30. As described herein, the controller 24 operates to coordinate the detection of a receptacle and/or user input with the sensor 6, with the operation of the electromechanical dispense component 38 to dispense ice while also controlling the visual feedback device 9 to communicate an operational status of the dispenser to a user. As depicted, the detection system 11 The sensor 6 may be a transceiver that both sends and receives signals, or may be divided into multiple separate transmitter and/or receiver components that work together. For example, an infrared time-of-flight based sensor may be used (e.g., that detects a distance from the sensor 6), or other touchless input devices such as a vision system, LIDAR, RADAR, Ultrasonic, or others known in the art.

The sensor 6 is located in a housing 100 which is positioned behind the chute 42, and exemplarily further contains the visual feedback device 9. The housing 100 and the contents therein are described in detail later herein. As shown, the sensor 6 is capable of detecting objects within, in the present case, a cone beam 5 centered about a center C. The cone beam 5 exemplarily has a width W and a maximum effective distance D. It will be recognized that due to the cone shape, that the width of the beam 5 increases as the distance from the sensor 6 increases. The maximum effective distance D may be a function of the sensor itself, or in other cases may be defined by a physical obstruction, for example a drip tray 22 positioned below the outlet 46 of the chute 42. Objects within the beam 5, reflect a portion of the transmitted signal to the receiver of the sensor 6. The reflected portion of the beam 5 identifies the presence of an object within the beam 5, but from this information, a distance from the sensor 6 to the object can be determined. As is further explained herein, the horizontal position of a receptacle, e.g. a cup can be determined from this signal as well. The information from the sensor 6 is used as described herein to initiate and cease the dispense of ice.

As will be described in further detail herein, various configurations of the beam 5 have been determined which are particularly advantageous for the touchless dispense of ice into a receptacle. As shown in FIG. 2, the sensor 6 may be angled or produce a beam 5 in which the center line C is angled. The sensor 6 is exemplarily angled at an angle A relative to the horizontal to produce a beam with the center line C angled at the same angle relative to the vertical. In an example, the center line C of the beam 5 is angled at about 7.5° out of vertical. However, other sensor angles A are also anticipated by the present disclosure, including angles within the range of 3-12°. Additionally, as will be described in further detail herein, the beam 5 may be divided into two or more detection bands which are used for the detection of an object within the beam 5 and/or for subsequent analysis and action taken by the controller 24. In an example, the beam 5 includes a detection band B, which for example represents distances between 1.0 cm and 10.0 cm away from the sensor 6. This is one example given and the distance ranges for the detection band B can greater or smaller values than those given in this example. In other examples, the detection bands may be distances between 0.0 cm-1.0 cm and between 7.0 cm-10.0 cm, although other ranges will also be recognized. In other examples, the position of the bottom tray 22 is such that the entirety of the beam 5 from the sensor to the bottom tray is within the effective distance. Similarly any receptacle used within an example of the ice dispensing system 30 will fall within the maximum effective distance D of the beam 5 and sensor 6 is required (e.g., that all anticipated cups will be close enough to the ice chute 42 such that ice is accurately received in the cup). Likewise, it is not required that any minimum distance D1 is required.

Figure 3:
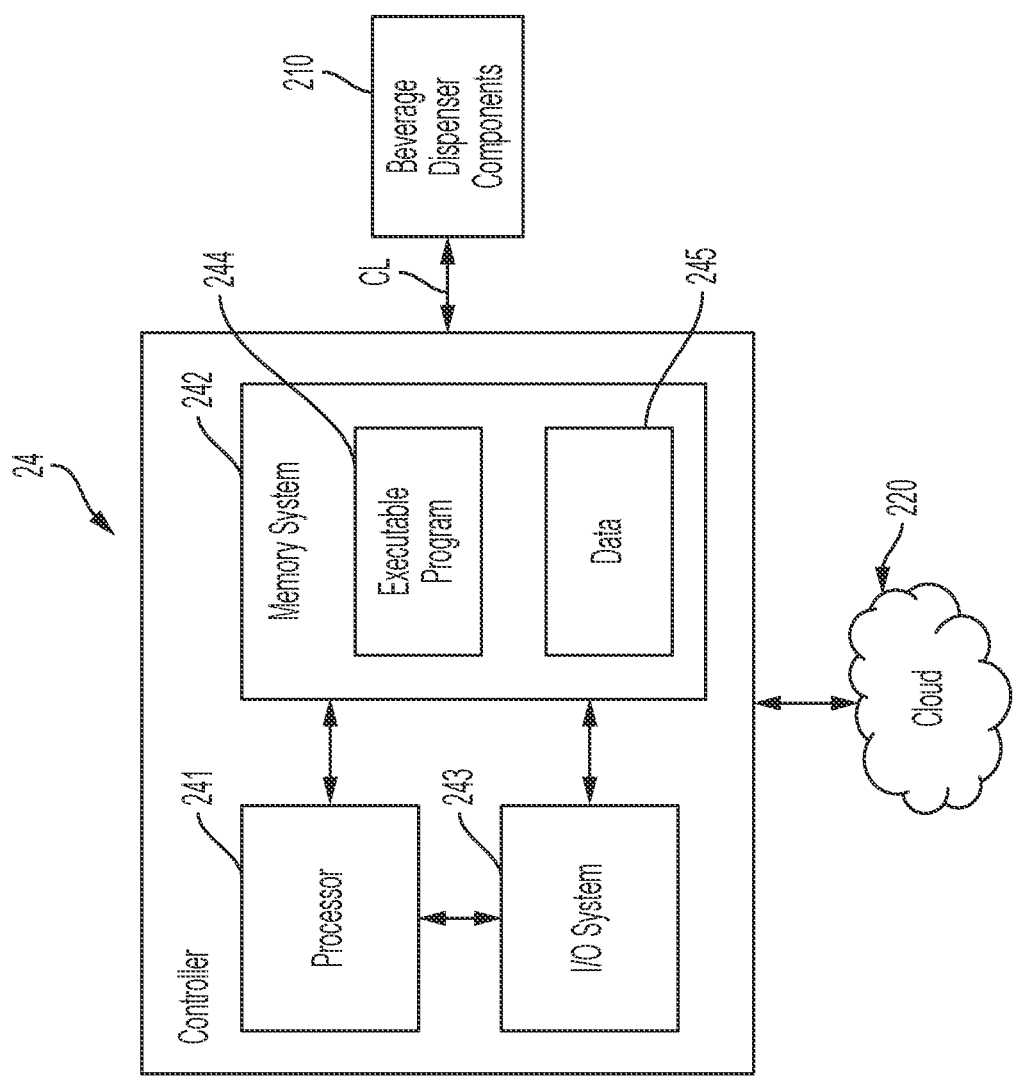
FIG. 3 is a schematic representation of a controller of an ice dispensing system.

FIG. 3 depicts a more detailed view of a controller 24 as referenced above with respect to FIG. 2. As will be discussed further below, the detector system of the present disclosure may also or alternatively contain a separate detector controller 7 (see FIG. 7), which may also be configured in the same or a similar manner to the control system 200 to be described here. In such examples, the controller 7 and the controller 24 may be communicatively connected and function to jointly carry out the operations described herein. It will be recognized that certain aspects of the present disclosure are described or depicted as functional and/or logical block components or processing steps, which may be performed by any number of hardware, software, and/or firmware components configured to perform the specified functions. For example, certain embodiments employ integrated circuit components, such as memory elements, digital signal processing elements, logic elements, look-up tables, or the like, configured to carry out a variety of functions under the control of one or more processors or other control devices. The connections between functional and logical block components are merely exemplary, which may be direct or indirect, and may follow alternate pathways.

In certain examples, the controller 24 communicates with each of the one or more components 210 of the beverage dispenser 1 via a communication link CL, which can be any wired or wireless link. The controller 24 is capable of receiving information and/or controlling one or more operational characteristics of the beverage dispenser components 210 by sending and receiving control signals via the communication links CL. In one example, the communication link CL is a controller area network (CAN) bus; however, other types of links could be used. It will be recognized that the extent of connections and the communication links CL may be one or more shared connections, or links, among some or all of the beverage dispenser components 210. Moreover, the communication link CL lines are meant only to demonstrate that the various control elements are capable of communicating with one another, and do not represent actual wiring connections between the various elements, nor do they represent the only paths of communication between the elements. Additionally, the beverage dispenser components 210 may incorporate various types of communication devices and systems, and thus the illustrated communication links CL may represent various types of wireless and/or wired data communication systems.

The controller 24 may be a computing system that includes a processor 241, memory 242 embodied on one or more non-transient computer-readable media, and input/output (I/O) system 243 for communicating with the beverage dispenser components 210, as will be discussed in further detail herein. The dispenser components 230 in FIG. 2 generally refer to other electronic components of the ice dispensing system 30, as described herein including, but not limited to, the electromechanical dispense component 38, the visual feedback device 9, and the one sensor 6 (FIG. 1). The processor 214 loads and executes an executable program 244 from the memory 242. The processor 214 also accesses data 245 stored within the memory 242 and processes inputs received from the beverage dispenser components 210 to produce control signals which are communicated to beverage dispenser components 210 to carry out the functions as described herein.

The processor 241 may be implemented as a single microprocessor or other circuitry, or be distributed across multiple processing devices or sub-systems that cooperate to execute the executable program 244 from the memory 242. Non-limiting examples of the processor 241 include general-purpose central processing units, application-specific processors, and logic devices.

The memory 242 may comprise any storage media readable by the processor 241 and capable of storing the executable program 244 and/or data 245. The memory 242 may be implemented as a single storage device, or be distributed across multiple storage devices or sub-systems that cooperate to store computer readable instructions, data structures, program modules, or other data. The memory 242 may include volatile and/or non-volatile systems, and may include removable and/or non-removable media implemented in any method or technology for storage of information. The storage media be non-transitory random access memory, read-only memory, magnetic discs, optical discs, flash memory, virtual memory, and non-virtual memory, magnetic storage devices, or any other storage medium which can be used to store information and be accessed by an instruction execution system.

FIGS. 4A and 4B present the ice dispensing system 30 as shown and described above with respect to FIG. 2 during different states of activation with respect to the dispense of ice into a receptacle 4, which may be a cup. As noted previously, the detection system 11 detects the presence of the receptacle 4 and the controller 24 analyzes the signals provided by the sensor 6 to operate the electromechanical dispense component 38, which may be a traditional 24 VAC valve, between open and closed positions to touchlessly dispense ice.

Referring to FIG. 4A, the receptacle 4 is moved towards the dispense area 44 of the ice dispensing system 30. The angled cone beam 5 extends the cone beam 5 into the dispense area 44, and a portion of the receptacle 4 is eventually detected. In an example the detection system 11 operates such that the controller 24 counts a delay from when the cup first enters the detection band B, before the electromechanical dispense component 38 is operated to open to initiate the dispense of ice. This action helps to reject inadvertent or unintentional transient interactions which may be detected by the sensor. In certain examples, the delay may be 200 ms of continuous detection of an object within the detection band B, while it will be recognized that this delay may be a variety of values or value ranges, including, but not limited to 150 ms, 120 ms, 100 ms, 75 ms, 50 ms, values therebetween, and other longer values, for example.

It will be recognized that a position of the receptacle 4 relative to the outlet 46 of the chute 42 can be determined based upon the signal from the sensor 6. Because the signal at the sensor is an indication of the closest point of the receptacle to the sensor 6 that is within the cone beam 5, and particularly since the beam 5 is further angled in the direction to extend into the dispense area 44 below the outlet 46, given known expected dimensions of the receptacle to be used, an estimated distance D2 of the receptacle 4 to a back wall 21 of the ice dispensing system 30 can be calculated. This estimated distance from the receptacle 4 to the back wall 21 can be comped to a known location of the center point CP of the outlet 46 of the chute 42. In this manner, the detection zone B can be defined based upon expected receptacle dimensions and distances D1 from the sensor 6 that correspond to particular distances D2 of the cup to the reference back wall 21 and alignment with the outlet 46 of the chute 42. It will be recognized that due to the angle of the cone beam 5, and the extent of the cup in the vertical dimension, that as a portion of the cup is detected closer to the sensor 6, that the estimated distance D2 of the receptacle to the back wall 21 decreases, indicating that the receptacle is increasingly positioned within the dispense area or below the outlet 46 of the chute.

Figure 8:
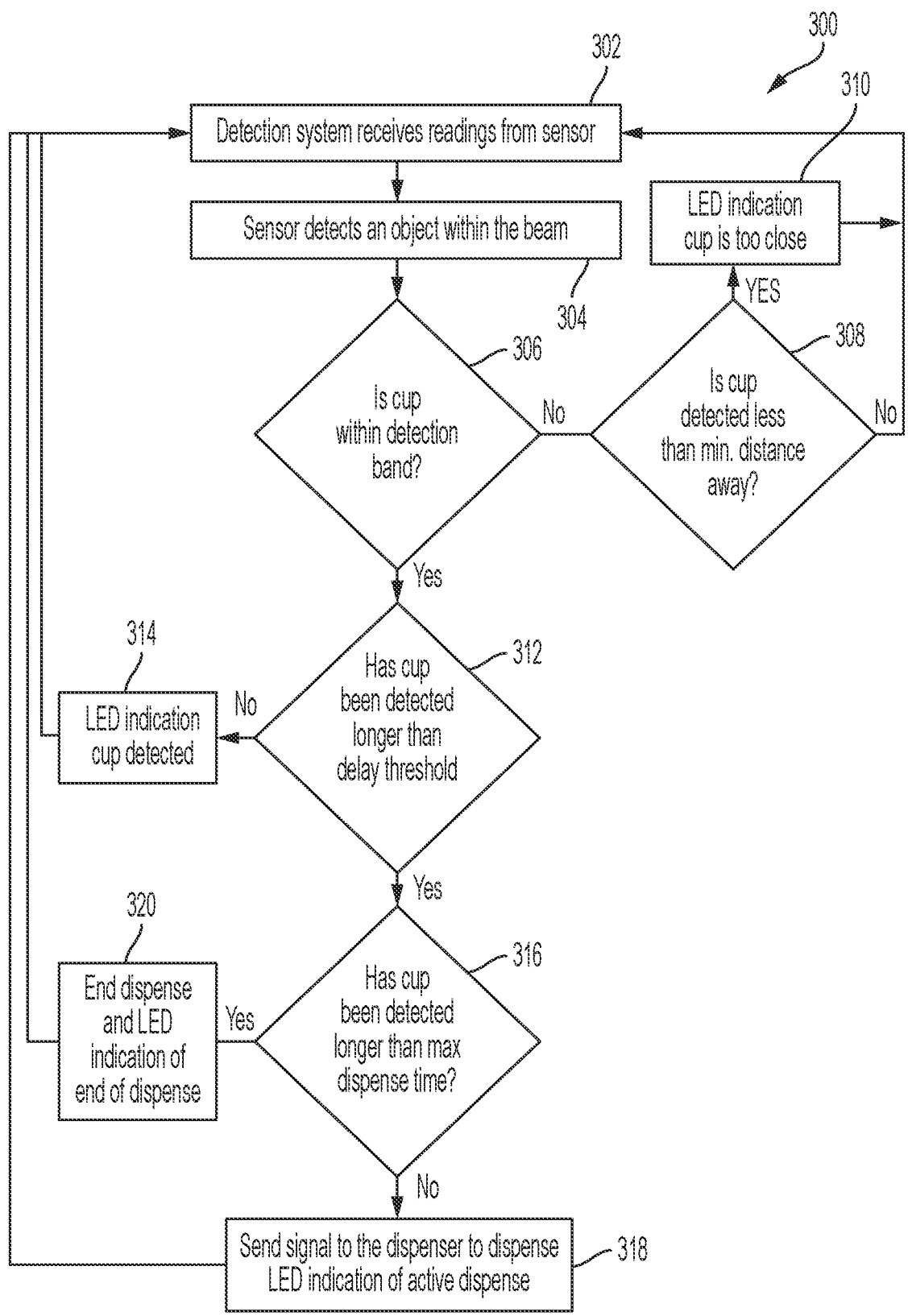
FIG. 8 is a flow chart that depict an exemplary method of controlling a dispenser.

The controller 24 may further operate at least one visual feedback device 9 in response to the signals provided by the sensor 6 as well. In an example, the visual feedback device 9 is an LED (and which may be an array of LEDs) which illuminate to provide feedback to the user. The visual feedback device 9 may in other examples, be another form of controllable illumination, including but not limited to incandescent lights or a graphical display, including but not limited to LCD or OLED graphical displays. As will be described in further detail herein, the visual feedback device 9 may be located within the housing 100 and illuminate through the cover 34 of the chute 42, which is exemplarily constructed of a transparent or semi-transparent material, such that the light from the visual feedback device 9 is perceptible by the user through the ice chute 42. In an example, the cover 34 may diffuse the light from the visual feedback device 9, to produce a glowing effect of the cover 34 as the light from the visual feedback device 9 spreads through the cover 34. The controller 24 may operate the visual feedback device 9 to provide feedback regarding the operational state of the ice dispensing system 30. For example, when no object is detected within the beam 5, the controller 24 can operate an LED of the visual feedback device 9 to present an indication that the system 30 is ready for a user operation. The LED 9 may be illuminated to another color or condition (e.g. blinking) to indicate the receptacle has been detected, but the system is in the delay time prior to initiating a dispense of ice. The LED 9 can further be illuminated to a still further color or condition to indicate that ice is actively being dispensed. Various treatments may also be applied to the LED 9 and/or ice chute 42 such that the light is not limited to only being a discrete point of emission, but may otherwise cause at least a portion of the ice chute 42 to glow, or display a pattern or text, for example. An exemplary process flow for controlling the ice dispensing system 30 using a detection system 11 according to the present disclosure is also shown in FIG. 8.

It will be recognized that the LED 9 may be other light emitting devices or displays, and may be multiple LEDs 9 or other such devices. The indications provided by the LED 9 may also, or alternatively, be provided on a front display 12 of the dispenser 1 (FIG. 1), which may display a message such as "Dispensing" along with a graphic and countdown timer, for example. Likewise, the one or more LEDs 9 or other indicators may be used other than to be solidly on while dispensing. For example, an LED 9 may flash or illuminate in a different color if an object (e.g., the cup) is too close to the sensor 6.

In a typical operation, the ice dispensing system 30 remains in the dispensing state until either the receptacle 4 is withdrawn from the dispense area (as detected in the manners as described herein) or if the controller 24 operates to count that a maximum ice dispense time has been reached (e.g. 5 s or 10 s, or another suitable time). Referring to FIG. 4B, when the user desires to end the dispense of ice, the user withdraws the receptacle 4 in the direction of arrow 50, this Removing the receptacle 4 out of the beam 5 (or for example, out of a detection band B of the beam 5) registers as an increasingly distant detection of the distance D1 of the detected portion of the receptacle 4 to the sensor 6. As noted above, this corresponds to a similarly increasing estimated distance D2 of the cup from the back wall 21, or similarly moving the receptacle 4 out of the dispense area 44 or out from under the outlet 46 of the chute 42. The controller 24 operates to process the signals from the sensor 6 and to operate the electromechanical dispense component 38 into the closed position, when the center point CP of outlet 46 of the dispense chute 42 is less than a threshold distance D3 away from the rim R of the receptacle. The threshold distance D3 exemplarily represents a distance wherein the receptacle remains approximately 50% under the outlet 46 of the chute 42. This allows for any "free flight" ice 52 remaining within the chute 42 to fall in the receptacle 4, rather than onto the drip tray 22, on the user's hand, or other undesirable locations. The determination of the withdrawal of the receptacle and to close the electromechanical dispense component 38 may be further based upon the estimated cup distance D2 from the back wall 21 wherein the controller 24 operates to close the electromechanical dispense component 38, when D2+D3 is greater than a distance CPD from the back wall 21 to the center point CP.

Figure 6:
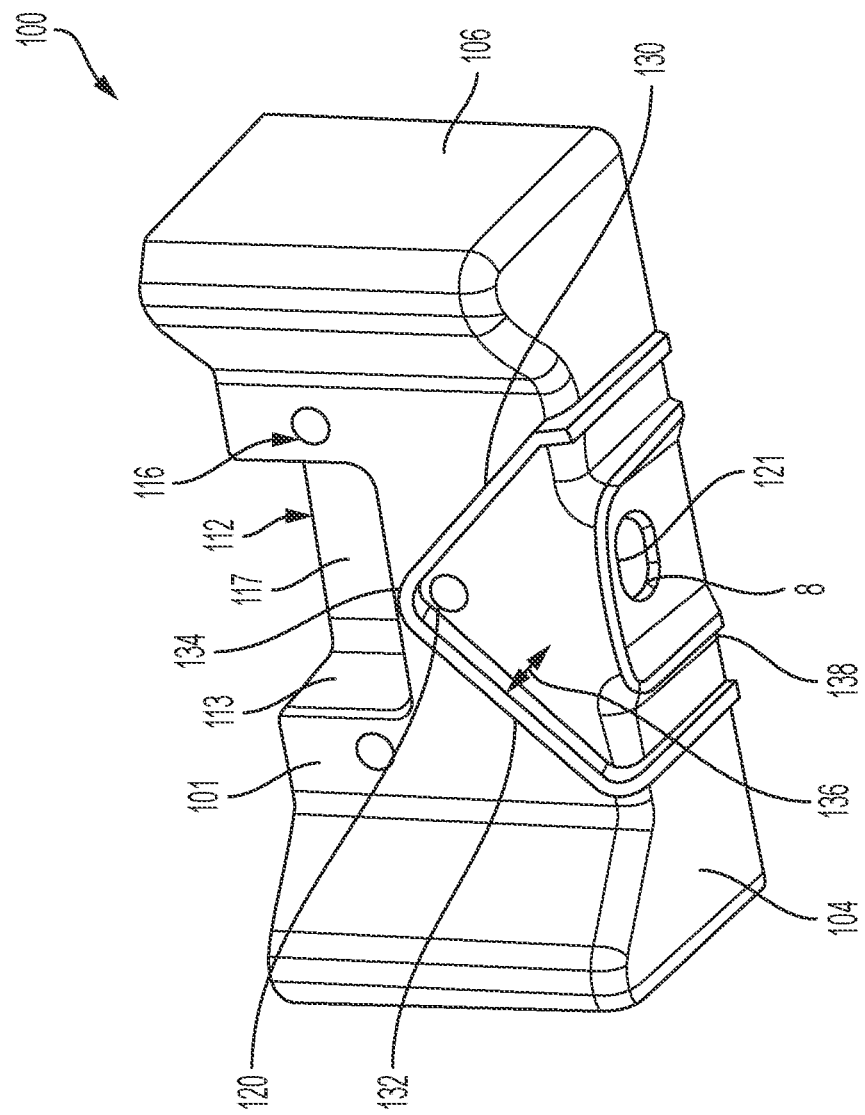
FIG. 6 is a front perspective view of an example of a housing of the ice dispensing system.
Figure 7:
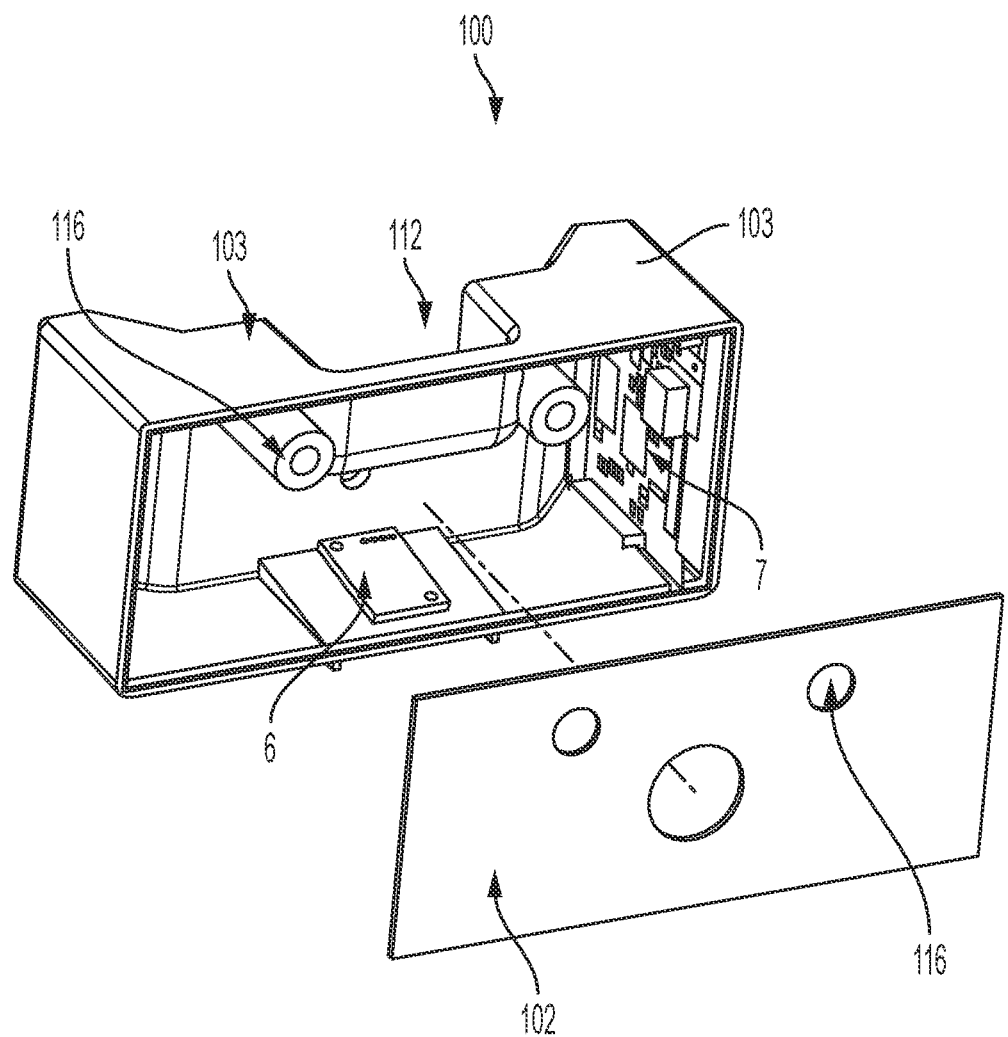
FIG. 7 is an exploded rear perspective view of the housing of FIG. 6.

The detection systems 11 disclosed herein may be built directly into new dispensers, or also added onto existing dispensers as a retrofittable device. In examples as described herein, the detection system 11 may be contained within a housing 100. FIGS. 5-7 depict an example of the detection system 11. FIG. 5 depicts the detection system 11 secured to the ice dispensing system 30. In FIG. 5, the ice chute cover 34 has been removed from the ice chute 42 for visibility. FIG. 6 is a front perspective view of the detection system 11. FIG. 7 is a rear perspective view of the detection system with the back panel 02 of the housing removed. The detection system 11 includes the sensor 6, LED 9 (or visual feedback device), and control electronics within detector controller 7. The detector controller may operate the sensor 6 and/or the LED 9 and may be communicatively connected to the controller 24 as previously described. The sensor 6 and the detector controller 7 may exemplarily be provided as a VL6180 proximity sensing module manufactured by STMicroelectronics. In other examples, the ice dispensing system 30 may operate with a single controller. The components of the detection system 11 are contained within a housing 100.

The housing 100 has a front 101 and back panel 102, which in certain embodiments is formed as a separate piece such that the various components may be placed therein. An emitter opening 120 is defined within the front 101 and permits the LED 9 contained within the housing 100 to emit light forwardly towards the ice chute 42. The housing 100 is further defined as having a top 103 opposite a bottom 104, and a left side 105 opposite a right side 106. A sensor opening 121 is defined through the bottom 104. A lens 8 may extend across the sensor opening 121 in front of the sensor 6. A cavity 112 is defined into the exterior of the housing 100 from the front 101 and the top 103. The cavity 112 is defined by cavity sides 113, a cavity floor 115, and a cavity back 117. The cavity 112 is dimensioned to fittingly receive an alignment tab 110 that extends from a bottom of the ice chute base 32. Seating of the alignment tab 110 within the cavity 112 positions the detector system 11, and particularly the sensor 6 and the visual feedback device 9, relative to the ice chute 42. Once aligned to the ice chute 42, the housing 100 may be fixed to the back wall 21 of the dispenser 1, for example via fasteners 114 received within openings 116 in the housing 100 and back wall 21. In an example wherein the detection system 11 is a retrofit for an existing dispenser, then the detection system may secure within the screw holes from the original ice lever. Persons of ordinary skill in the art will recognize from this disclosure that the housing may be secured in other manners and to other components of the ice dispensing system 30.

The housing 100 is also constructed in consideration of the particular challenges with placing electronics in close proximity to dispensed items. In certain examples, the housing 100 has a molded plastic construction designed to have no seams. This ensures that water, condensation, or moisture more generally is kept away from the controller 7, sensor 6, and LED 9. The sensor lens 8 and the LED 9 may be potted within the respective openings 120, 121 to prevent water ingress. The back panel 102 of the housing 100 seals the interior of the housing and may include a gasket to further limit moisture.

As best shown in FIG. 6, the housing 100 may include further water or moisture management features. An anti-drip gutter system 130 prevents water or condensate from accumulating and dripping around or in front of the leading edge of the housing 100, including the sensor 6 and/or the visual feedback device 9. Dripping water can obstruct the sensor 6 or be interpreted by the system as a detection of a receptacle to trigger causing what is called "ghost pours," and/or cause damage to components. The gutter system 130 includes a lip 132 that protrudes a distance 136 from the front 101 of the housing 100. The lip 132 may extend around the bottom 104 of the housing 100. The front lip 132 meets at an apex 134. Lips 138 extend from the bottom 104 interior of the lip 132 towards the sensor 6. The lips 138 may extend about the sides and the front of the sensor 6. In total, these edges of the lips 132, 138 are designed to redirect water and condensate away from the sensor 6.

FIG. 8 is a flow chart that depicts an example of a method 300 of operating a dispenser, for example an ice dispensing system 30, to dispense ice into a cup. At 302 the dispensing system operates to receive a signal from the sensor 6, which is exemplarily a proximity sensor arranged with a cone beam of detection across a dispense area of the ice dispensing system. At 304, the controller 24 detects a change in the signal from the sensor 6 indicative of an object within the beam of the sensor. At 306, the controller 24 processes the signal to determine if the object is within a detection band of distance from the sensor. The controller 24 may operate in the manners as previously described to determine if the detected object is within the detection band. The detection band may represent cup positions within the dispense area in which ice dispensed through the ice chute will be received within the cup.

If the object is not within the detection band, the controller 24 further determines at 308 if the object is detected too less than a minimum distance from the sensor. If the object is detected within the minimum distance, then the controller 24 operates an LED 9 at 310 to indicate that the cup is too close.

If the object is determined to be within the detection band at 306, then at 312, the controller 24 further determines if the cup has been within the detection band longer than a delay threshold. In examples, the delay threshold may be between 50 ms and 1000 ms. If the object has been within the detection band for less than the delay threshold, then the controller 24 may optionally at 314 operate the LED 9 to provide a visual indication that the cup has been detected, but dispense has not yet been initiated.

If the delay threshold has been met, then a further determination is made by the controller 24 at 316 if the object has been detected longer than a maximum dispense time. If a maximum dispense time, which may exemplarily be between 2.0 s and 10.0 s, has not yet been reached, then at 318, the controller 24 provides control signals to the electromechanical components of the dispensing system 30 to initiate a dispense of ice. This may include the operation of a valve, which may be a gate, an actuator, and/or an auger. The controller 24 also operates the LED 9 to provide a visual indication that the ice dispensing system 30 is actively dispensing ice. If the cup is removed, and no object is detected within the beam any longer or the max dispense time has been reached, then at 320 the controller operates the electromechanical components of the dispensing system 30 to end the dispense of ice and operate the LED 9 to provide a visual indication that the ice dispense has ended.

The functional block diagrams, operational sequences, and flow diagrams provided in the Figures are representative of exemplary architectures, environments, and methodologies for performing novel aspects of the disclosure. While, for purposes of simplicity of explanation, the methodologies included herein may be in the form of a functional diagram, operational sequence, or flow diagram, and may be described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology can alternatively be represented as a series of interrelated states or events, such as in a state diagram. Moreover, not all acts illustrated in a methodology may be required for a novel implementation.

This written description uses examples to disclose the invention, including the best mode, and also to enable any person skilled in the art to make and use the invention. Certain terms have been used for brevity, clarity, and understanding. No unnecessary limitations are to be inferred therefrom beyond the requirement of the prior art because such terms are used for descriptive purposes only and are intended to be broadly construed. The patentable scope of the invention is defined by the claims and may include other examples that occur to those skilled in the art. Such other examples are intended to be within the scope of the claims if they have features or structural elements that do not differ from the literal language of the claims, or if they include equivalent features or structural elements with insubstantial differences from the literal languages of the claims.

What is claimed is:

1. A system for touchlessly dispensing ice, the system comprising:
    a dispense chute configured to direct dispensed ice therethrough to a dispense area;
    a visual feedback device configured to present a visual indication of an operational status of the system;
    a sensor configured to produce a beam within the dispense area and to provide a signal indicative of a proximity of an object within the beam to the sensor; and
    a controller configured to receive the signal from the sensor and to determine the proximity of the object to the sensor from the signal, and to operate the system to initiate a dispense of ice through the dispense chute based upon the determined proximity of the object after the object has been detected within a detection band of proximity to the sensor for a predetermined delay time, and to operate the visual feedback device to present a visual indication of the initiated ice dispense.

2. The system of claim 1, wherein the sensor is located within a housing, the housing positioned between the dispense chute and a back wall that at least partially defines the dispense area.

3. The system of claim 2, wherein the beam from the sensor is a cone beam and a center line of the cone beam is angled relative to the vertical into the dispense area.

4. The system of claim 3, wherein the controller initiates the dispense of ice based upon a detection of an object within the detection band of proximity to the sensor.

5. The system of claim 4, wherein the controller determines a distance of the object from the back wall from the signal from the sensor.

6. The system of claim 1, further comprising at least one electromechanical dispense component arranged between a hopper configured to hold ice and the dispense chute, wherein the controller operates the at least one electromechanical dispense component to initiate the dispense of ice.

7. The system of claim 6, wherein the electromechanical dispense component comprises a valve.

8. The system of claim 2, wherein the visual feedback device is located behind the dispense chute.

9. The system of claim 8, wherein the visual feedback device comprises a light emitting diode (LED) and the dispense chute is transmissive to light, wherein light emitted from the LED passes through the dispense chute.

10. The system of claim 8, wherein the visual feedback device is located within the housing.

11. The system of claim 10, wherein the housing further comprises at least one lip extending forward of the housing to direct condensation away from the visual feedback device.

12. The system of claim 11, further comprising at least one lip extending downward from the housing to direct condensation away from the sensor.

13. A system for touchlessly dispensing ice, the system comprising:
    a dispense chute configured to direct dispensed ice therethrough to a dispense area;
    a visual feedback device configured to present a visual indication of an operational status of the system;
    a sensor positioned between the dispense chute and a back wall that at least partially defines the dispense area, the sensor configured to produce a cone beam and a center line of the cone beam is angled relative to the vertical into the dispense area and to provide a signal indicative of a proximity of an object within the beam to the sensor; and a controller configured to receive the signal from the sensor and to determine the proximity of the object to the sensor from the signal, and to operate the system to initiate a dispense of ice through the dispense chute based upon a detection of an object within a detection band of proximity to the sensor and to operate the visual feedback device to present a visual indication of the initiated ice dispense, wherein the controller compares the determined distance of the object from the back wall to a distance of the dispense chute to the back wall, and ends the dispense of ice based upon the comparison.

14. The system of claim 13, wherein the controller ends the dispense of ice when the distance of the object from the back wall reaches a threshold distance to a center point of the opening of the dispense chute.

15. A system for touchlessly dispensing ice, the system comprising:
- a dispense chute configured to direct dispensed ice therethrough to a dispense area;
- a visual feedback device behind the dispense chute and located within a housing positioned between a back wall and the dispense chute, the visual feedback device configured to present a visual indication of an operational status of the system;
- a sensor configured to produce a beam within the dispense area and to provide a signal indicative of a proximity of an object within the beam to the sensor; and
- a controller configured to receive the signal from the sensor and to determine the proximity of the object to the sensor from the signal, and to operate the system to initiate a dispense of ice through the dispense chute based upon the determined proximity of the object and to operate the visual feedback device to present a visual indication of the initiated ice dispense;
- wherein the dispense chute comprises an alignment tab and the housing comprises a cavity in the top and front surfaces of the housing, wherein the alignment tab is received within the cavity to locate the visual feedback device and the sensor relative to the dispense chute.

16. A system for touchlessly dispensing ice, the system comprising:
- a dispense chute configured to direct dispensed ice therethrough to a dispense area at least partially defined by a back wall;
- at least one electromechanical dispense component arranged between a hopper configured to hold ice and the dispense chute;
- a housing positioned between the dispense chute and the back wall;
- a visual feedback device located within the housing and configured to present an visual indication of an operational status of the system;
- a sensor located within the housing and configured to produce a cone beam and a center line of the cone beam is angled relative to the vertical into the dispense area and to provide a signal indicative of a proximity of an object within the cone beam to the sensor; and
- a controller configured to receive the signal from the sensor and to determine the proximity of the object to the sensor from the signal, and to operate the at least one electromechanical dispense component to initiate a dispense of ice from the hopper through the dispense chute based upon a detection of the object within a detection band of proximity to the sensor and to operate the visual feedback device to present a visual indication of the initiated ice dispense, wherein the controller initiates the dispense of ice after the object has been detected within the detection band of proximity to the sensor for a predetermined delay time.

17. The system of claim 16, wherein the visual feedback device comprises a light emitting diode (LED) and the dispense chute is transmissive to light, wherein light emitted from the LED passes through the dispense chute.

18. A system for touchlessly dispensing ice, the system comprising:
- a dispense chute configured to direct dispensed ice therethrough to a dispense area at least partially defined by a back wall;
- at least one electromechanical dispense component arranged between a hopper configured to hold ice and the dispense chute;
- a housing positioned between the dispense chute and the back wall;
- a visual feedback device located within the housing and configured to present an visual indication of an operational status of the system;
- a sensor located within the housing and configured to produce a cone beam and a center line of the cone beam is angled relative to the vertical into the dispense area and to provide a signal indicative of a proximity of an object within the cone beam to the sensor; and
- a controller configured to receive the signal from the sensor and to determine the proximity of the object to the sensor from the signal, and to operate the at least one electromechanical dispense component to initiate a dispense of ice from the hopper through the dispense chute based upon a detection of the object within a detection band of proximity to the sensor and to operate the visual feedback device to present a visual indication of the initiated ice dispense, wherein the controller further operates to:
- determine a distance of the object from the back wall from the signal from the sensor; and
- compare the determined distance of the object from the back wall to a distance of the dispense chute to the back wall;
- wherein the controller operates to end the dispense of ice when the determined distance of the object from the back wall reaches a threshold distance to a center point of the opening of the dispense chute.

* * * * *